(12) United States Patent
Fattaruso et al.

(10) Patent No.: US 6,239,731 B1
(45) Date of Patent: *May 29, 2001

(54) DATA CONVERTER WITH REDUCED SUPPLY AND RESISTOR STRING VOLTAGES

(75) Inventors: John W. Fattaruso, Dallas, TX (US); Shivaling S Mahant-Shetti, Karnataka (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 09/309,642

(22) Filed: May 11, 1999

(51) Int. Cl.[7] .............................. H03M 1/78; H03M 1/66
(52) U.S. Cl. ............................................ 341/144; 341/154
(58) Field of Search .................................... 341/144, 154, 341/163, 145, 146; 327/530, 67, 65

(56) References Cited

U.S. PATENT DOCUMENTS 5,374,859 * 12/1994 Doyle et al. ........................... 327/65
6,127,957 * 10/2000 Fattaruso et al. ..................... 341/154

* cited by examiner

*Primary Examiner*—Patrick Wamsley
(74) *Attorney, Agent, or Firm*—Pedro P. Hernandez; W. James Brady, III; Frederick J. Telecky, Jr.

(57) ABSTRACT

A data converter (20). The data converter comprises an input ($I_0'$–$I_3'$) for receiving a digital word and an output ($V_{OUT2}$) for providing an analog voltage level in response to the digital word. The data converter further comprises at least one string (12') of series connected resistive elements (R0'–R14'). The at least one string comprises a plurality of voltage taps (T0'–T14') and is operable to receive a string bias of X volts ($V_{REF2}$). Lastly, the data converter comprises a plurality of switching transistors (ST0n–ST15n; ST0p–ST15p) coupled between the plurality of voltage taps and the output. Specifically, responsive to at least a portion of the digital word, selected ones of the switching transistors are operable to receive a gate bias to enable the corresponding switching transistor to provide a conductive path from a corresponding one of the voltage taps toward the output. In addition, the difference between X volts and the gate bias is less than approximately 2.0 volts.

20 Claims, 5 Drawing Sheets

DATA CONVERTER WITH REDUCED SUPPLY AND RESISTOR STRING VOLTAGES

CROSS REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to data converters, and are more particularly directed to converters using resistor strings.

Data converters may be used in various types of electronic circuits, or may be formed as a single integrated circuit device. Such converters typically take one of two forms, either as a digital-to-analog converter ("DAC") or an analog-to-digital converter ("ADC"). For the DAC, its operation converts an input digital signal to an output analog signal, typically where the amplitude of the output analog signal corresponds directly to the magnitude of the input digital signal. Conversely, the ADC converts an input analog signal to an output digital signal, typically where the value of the output digital signal corresponds directly to the amplitude of the input analog signal. In many configurations, both DACs and ADCs implement a resistor string that includes a number of series-connected resistors, where each resistor provides a voltage tap at each of its ends. Typically, the overall string is biased at opposing ends by two different reference voltages, where for example one such voltage is a positive voltage and the other is ground. Also in this regard, in an effort to maintain the linearity between the digital input and the analog output, a common concern in the art is to endeavor to ensure that each resistor in the string has as dose to the same resistance value as all other resistors in the string. Accordingly, the resistor string forms a series voltage dividing network and each of the voltage taps is accessible as part of the operation for the data conversion (i.e., either from digital to analog, or analog to digital).

For further background to converters and by way of example, FIG. 1 illustrates a typical configuration of a prior art DAC 10, and is detailed briefly below. In addition, since the primary focus of the preferred embodiments described later is directed to resistor strings as used in either a DAC or an ADC, the following discussion provides one example of such a string as used in a DAC, but is not unduly lengthened by also providing a detailed analysis of an ADC. Instead, such an understanding is left to one skilled in the art.

FIG. 1 illustrates a typical configuration of a prior art DAC 10, and is detailed briefly here with additional detail ascertainable by one skilled in the art. By way of example and as appreciated later, DAC 10 is a 4-input 16-output DAC, while numerous other dimensions may exist for different DAC configurations. In general and as detailed below, DAC 10 is operable to receive a 4-bit input word, designated from least significant bit to most significant bit as $I_0$–$I_3$, and in response to the magnitude of that input to output a corresponding analog voltage. Before detailing this operation, it is first instructive to examine the devices and connections of DAC 10. In this regard, DAC 10 includes a series-connected resistor string designated generally at 12, and which forms a meander in that it serpentines back and forth. Additionally, DAC 10 is generally an array in nature, having a number of bit lines in the vertical dimension and a number of word lines in the horizontal dimension. Since the example of DAC 10 presents a 4-input 16-output DAC, the array of DAC 10 includes four bit lines BL0 through BL3, and four word lines WL0 through WL3. Also for the current example of a 4-to-16 DAC, resistor string 12 includes fifteen resistive elements R0 through R14. Resistive elements R0 through R14 may be formed using various techniques, where the particular technique is not critical to the present inventive teachings. Regardless of the technique used to form the resistive elements, ideally each resistive element has as close to the same resistance value as all other resistors in the string. Moreover, a voltage source $V_{REF1}$ is applied across resistor string 12, and may be of any suitable biasing voltage, which for current applications is typically on the order of 2.0 volts. For DAC 10, string 12 is biased between $V_{REF1}$ and ground, but it should be understood that in other configurations two different non-ground potentials may be connected at opposing ends of string 12, while a key notion for purposes of the present teachings is the difference between these potentials. Thus, where ground is connected to one end of the string, it is easily appreciated that this difference of the potentials at the ends of the string equals $V_{REF1}$. In any event, and for reasons detailed below, note that $V_{REF1}$ is typically far less than the $V_{S1}$, the supply voltage for the remaining circuitry in DAC 10, in order to provide an adequate voltage difference between the two. Indeed, in the current example, this difference equals three volts (i.e., $V_{S1}$–$V_{REF1}$=5.0–2.0=3.0 volts).

Looking to the detailed connections with respect to the resistive elements in string 12, each resistive element provides two taps from which a voltage may be measured as detailed below. For example, looking to resistive element R0, it provides a tap T0 and a tap T1, while resistive element R1 shares the same tap T1 and provides another tap T2, and so forth. Each tap has a switching device connected between it and a corresponding output bit line. In the current example, each of these switching devices is an n-channel field effect transistor, and is labeled for convenience by combining the abbreviation ST (i.e., switching transistor) with the same numeric identifier corresponding to the tap to which a source/drain of the transistor is connected. For example, a source/drain of transistor ST0 is connected to tap T0, a source/drain of transistor ST1 is connected to tap T1, and so forth. Further, the switching transistors are arranged so that a like number of taps are coupled via corresponding switching transistors to a corresponding one of the bit lines. In the current example of DAC 10, four taps are coupled in this manner to a corresponding bit line. For example, taps T0 through T3 are coupled, via corresponding switching transistors ST0 through ST3, to bit line BL0. As another example, taps T4 through T7 are coupled, via corresponding switching transistors ST4 through ST7, to bit line BL1. Each bit line BL0 through BL3 is coupled via a respective column access transistor, CAT0 through CAT3, to a column decoder 14. More particularly and for reasons evident below, column decoder 14 is coupled to receive the two most significant bits (MSBs) of the 4-bit word input to DAC 10, and in response column decoder 14 controls the gates of column access transistors CAT0 through CAT3. Lastly, it should be understood that column decoder 14 operates in response to an overall system supply voltage $V_{S1}$ which, as discussed further below, is typically on the order of five volts.

Retuning now to switching transistors ST0 through ST15, and given the array nature of DAC 10, it is further appreciated that the switching transistors are arranged so that a like number of switching transistors are controlled, via connection to their gates, by a corresponding word line which is further connected to row decoder 16. Like column decoder 14, row decoder 16 is also responsive to the system supply voltage $V_{S1}$. Returning to the connectivity between row decoder 16 and the switching transistors, and in the current example of DAC 10, the gates of four switching transistors are coupled to each corresponding word line. For example, the gates of switching transistors ST0, ST7, ST8, and ST15 are coupled to word line WL0. As another example, the gates of switching transistors ST1, ST6, ST9, and ST14 are coupled to word line WL1. Lastly in this regard, and for reasons evident below, row decoder 16 is coupled to receive the two least significant bits (LSBs) of the 4-bit word input to DAC 10 (i.e., bits $I_1$ and $I_0$), and is also controlled in response to the least significant bit ("lsb"), $I_2$, of the two MSBs input to column decoder 14. More particularly, each least significant bit $I_0$ and $I_1$ is coupled as an input to a corresponding exclusive OR gate EOG0 and EOG1 as a first input, while the second input of exclusive OR gates EOG0 and EOG1 is connected to receive 12 (i.e., the least significant bit of the two MSBs input to column decoder 14). In response to these bits, row decoder 16 controls the gates of switching transistors ST0 through ST15 as detailed below.

The operation of DAC 10 is now described, first in general and then more specifically through the use of a few examples. A 4-bit digital word is connected to inputs $I_0$ through $I_3$ and ultimately causes signals to pass to column decoder 14 and row decoder 16. Generally, row decoder 16 includes sufficient logic circuitry or the like to respond by asserting one of word lines WL0 through WL3, thereby providing an enabling voltage to the gates of the four switching transistors coupled to the asserted word line. Similarly, column decoder 14 includes sufficient logic circuitry or the like to respond by enabling one of column access transistors CAT0 through CAT3, thereby causing the enabled transistor to pass the voltage from the corresponding one of bit lines BL0 through BL3 to output $V_{OUT1}$. In a simple case, the result of the above operations may be viewed by correlating the value of the 4-bit input to one of the sixteen decimal tap numbers. For example, if the 4-bit digital word equals 0001 (i.e., decimal value one), then DAC 10 enables a switching transistor and a column access transistor to couple the voltage at tap T1 to $V_{OUT1}$. Lastly in this regard, and assuming that each of the resistors in string 12 have the same resistance value, then the analog output voltage corresponding to the digital input will be $T\#/15*V_{REF1}$, where T# is the number of the tap that is accessed by the digital input signal. By way of detailed illustration of the operation of DAC 10, the example of an input equal to 0001 is now traced through DAC 10 in greater detail. From the input of 0001, its two MSBs are coupled to column decoder 14 and, thus, the value of 00 is received by column decoder 14. In response, column decoder 14 enables the gate of the column access transistor having a numeric identifier equal to the value of the MSBs. Here, the MSBs of 00 equal a decimal value of zero and, thus, column decoder 14 couples a voltage of $V_{S1}$ to the gate of column access transistor CAT0. Turning now to row decoder 16, it responds to the value of the two LSBs of the 4-bit input However, note that these two LSBs pass through exclusive OR gates and, therefore, their values are unchanged when passed to row decoder 16 if the lsb equals 0, or their complements are passed to row decoder 16 if the lsb equals 1. Returning then to the example of a 4-bit input equal to 0001, the two LSBs equal 01 and the lsb of the two MSBs equals 0. Thus, the unchanged value of 01 reaches row decoder 16, and row decoder 16 in response asserts the word line having a decimal numeric identifier equal to the value of the two LSBs as received from gates EOG0 and EOG1. In the present example, therefore, row decoder 16 asserts word line WL1 high to a value of $V_{S1}$ which, therefore, enables each of switching transistors ST1, ST6, ST9, and ST14. Recall also that column decoder 14 in this example enables column access transistor CAT0. As a result, the voltage from tap T1 passes via switching transistor ST1 to bit line BL0, and then passes via column access transistor CAT0 to $V_{OUT1}$. Lastly, it is noted that the voltage at tap T1 is divided across one resistive element (i.e., R0) and, thus, for an input equal to 0001, the analog output voltage using voltage division is ⅟15 *$V_{REF1}$.

To further illustrate in detail the operation of DAC 10, consider now the example of an input equal to 0111 as traced through DAC 10. At the outset, from the general operation described above, one skilled in the art will expect that since the decimal value of 0111 equals seven, then the tap selected by DAC 10 for output is tap T7. This expectation is now confirmed through a detailed examination of this example. From the input of 0111, its two MSBs of 01 are coupled to column decoder 14. In response, column decoder 14 enables the gate of the column access transistor having a decimal numeric identifier equal to the two MSB values of 01 and, hence, the gate of column access transistor CAT1 is enabled. Turning now to row decoder 16, note first that the lsb of the two MSBs in his example equals one; consequently, gates EOG0 and EOG1 cause the complements of the two LSBs to reach row decoder 16. Thus, the complements of the 11 LSBs are 00 and, therefore, the value of 00 reaches row decoder 16. In response, row decoder 16 asserts word line WL0 high since that word line has a numeric identifier equal to the value of the two complemented LSBs. When word line WL0 is asserted, it enables each of switching transistors ST0, ST7, ST8, and ST15. Recall also that column decoder 14 in this example enables column access transistor CAT1. As a result, the voltage from tap T7 passes via switching transistor ST7 to bit line BL1, and then passes via column access transistor CAT1 to output $V_{OUT1}$. Lastly, it is noted that the voltage at tap T7 is divided across seven of the fifteen resistive elements (i.e., R0 through R6) and, thus, for an input equal to 0111, the analog voltage output using voltage division is equal to $7/15 *V_{REF1}$. Accordingly, the digital input of 0111 has been converted to an analog voltage which equals this divided voltage. Given this as well as the preceding example, one skilled in the art will further appreciate that with different digital inputs, any of the switching transistors of DAC 10 may be enabled along with enabling one of the column access transistors, and for each such combination of transistors there is a corresponding output which represents a divided voltage between zero volts or any value incrementing up from zero volts by ⅟15 $V_{REF1}$ (assuming equal resistance among the resistive elements), and up to an output equal to $V_{REF1}$.

The configuration of DAC 10 has been accepted in various contexts; however it has been observed in connection with the present embodiments that a drawback may arise in view of the difference between the string potential $V_{REF1}$ and the supply voltage $V_{S1}$. Particularly, assuming that access to any of the voltage taps of DAC 10 are achieved by a same polarity input, then the magnitude of $V_{REF1}$ must be quite a bit smaller than $V_{S1}$. This is because both column decoder 14 and row decoder 16 must be able to output a large enough voltage to allow any of the switching transistors to conduct strongly enough in its ohmic region of operation and quickly charge any capacitive load at $V_{OUT}$. This requirement is perhaps best appreciated with respect to the switching transistor(s) nearest $V_{REF1}$ and, thus, to further examine this concept attention is directed to switching transistor ST15. Specifically, a first source/drain of switching transistor ST15 is connected to $V_{REF1}$, and its gate is connected to word line WL0 which is driven by row decoder 16. Thus, when it is desired to enable switching transistor ST15, the bias applied by word line WL0 must impose a sufficiently large gate-to-source voltage across switching transistor ST15 so that it conducts in the appropriate fashion. Due to this requirement, $V_{REF1}$ cannot equal or be too near the level of $V_{S1}$. In other words, if $V_{REF1}$ were equal to or near $V_{S1}$ and word line WL0 were asserted with this supply voltage in an effort to enable switching transistor ST15, then the gate-to-source voltage for switching transistor ST15 would be equal to or near equal to zero volts. Consequently, switching transistor ST15 would not conduct satisfactorily. As a result, it is therefore necessary as introduced above that $V_{REF1}$ be sufficiently less than the supply voltage $V_{S1}$. For example, with a five volt $V_{S1}$, then $V_{REF1}$ is typically limited to perhaps 1.0 or 2.0 volts; in other words, in a typical prior art configuration, the difference between $V_{S1}$ and $V_{REF1}$ is commonly on the order of 3.0 to 4.0 volts.

The preceding discussion of $V_{REF1}$ relative to the DAC supply voltage $V_{S1}$ has been further scrutinized by the present inventors in connection with the evolution of supply voltages in general. More specifically, while the difference between $V_{REF1}$ and $V_{S1}$ may not be much of a limitation for a five volt device, it is noted by the present inventors that supply voltages are now migrating downward, such as to 3.3 volts or 1.8 volts, with even lower supply voltages in the foreseeable future. While supply voltages may become US, lower, however, there is a contrary factor in the DAC art that suggests keeping $V_{REF1}$ as high as possible.

Specifically, to achieve lower noise from resistive and semiconductor devices relative to the signal level, it is desirable to increase signal power; for example, increasing $V_{REF1}$ correspondingly increases the signal-to-noise ratio of the DAC. Given these conflicting notions (i.e., lowering supply voltages and maintaining $V_{REF1}$ as high as possible), the present inventors have recognized that there is a need to provide a DAC that operates satisfactorily with a considerably lower difference between the resistor string potential (e.g., $V_{REF1}$) and the supply voltage (e.g., $V_{S1}$). In addition, however, there is an additional need to provide such a DAC that may be implemented in a minimum area, such as in the case of a circuit built using a CMOS process. The present embodiments are directed to these concerns and, in providing various solutions improve both DAC and ADC technology.

BRIEF SUMMARY OF THE INVENTION

In one embodiment, there is a data converter. The data converter comprises an input for receiving a digital word and an output for providing an analog voltage level in response to the digital word. The data converter further comprises at least one string of series connected resistive elements. The at least one string comprises a plurality of voltage taps and is operable to receive a string bias of X volts. Lastly, the data converter comprises a plurality of switching transistors coupled between the plurality of voltage taps and the output. Specifically, responsive to at least a portion of the digital word, selected ones of the switching transistors are operable to receive a gate bias to enable the corresponding switching transistor to provide a conductive path from a corresponding one of the voltage taps toward the output In addition, the difference between X volts and the gate bias is less than approximately 2.0 volts. Other circuits, systems, and methods are also disclosed and claimed.

DETAILED DESCRIPTION OF THE INVENTION

Figure 1:
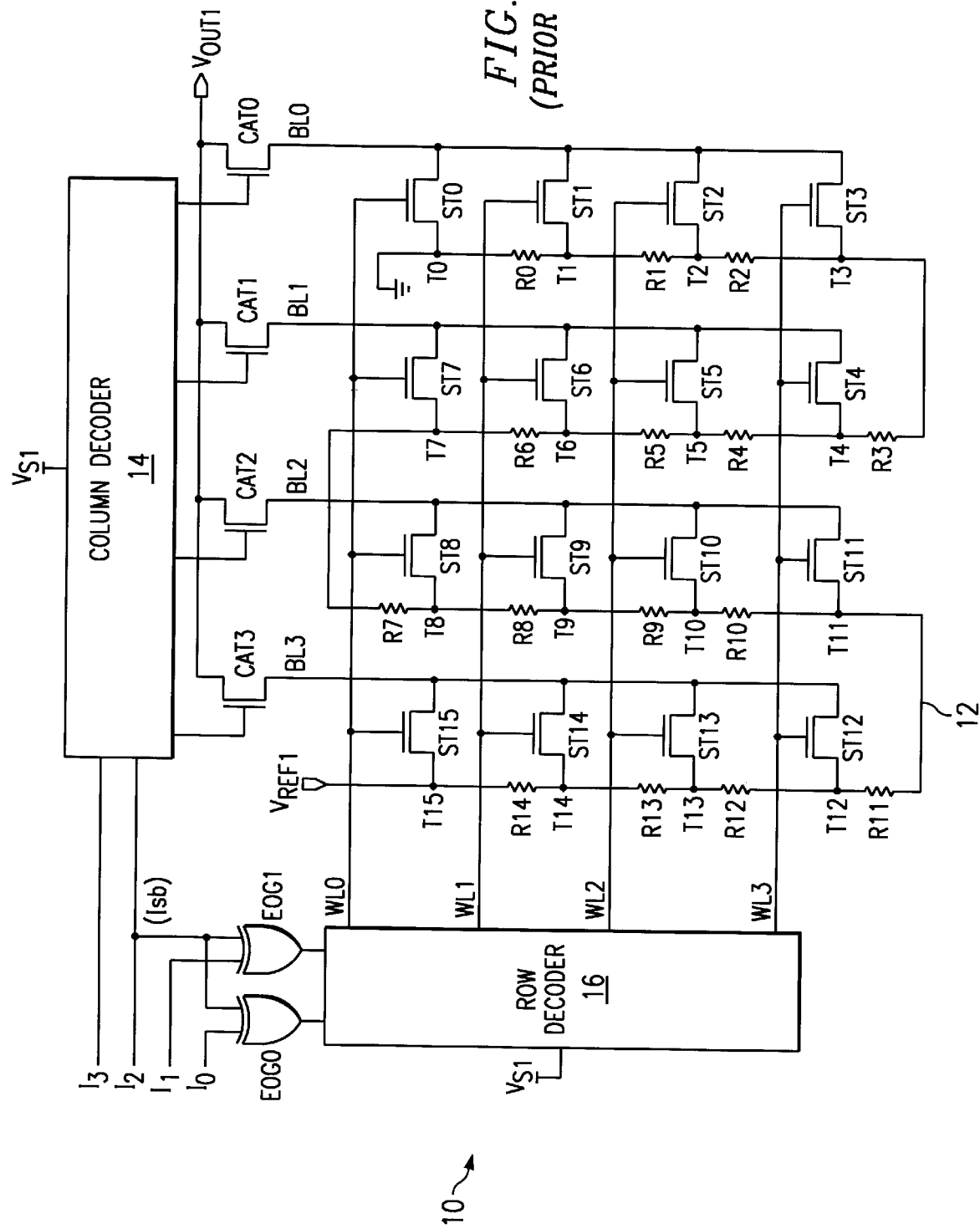
FIG. 1 illustrates a schematic of a prior art digital-to-analog converter ("DAC")
Figure 2:
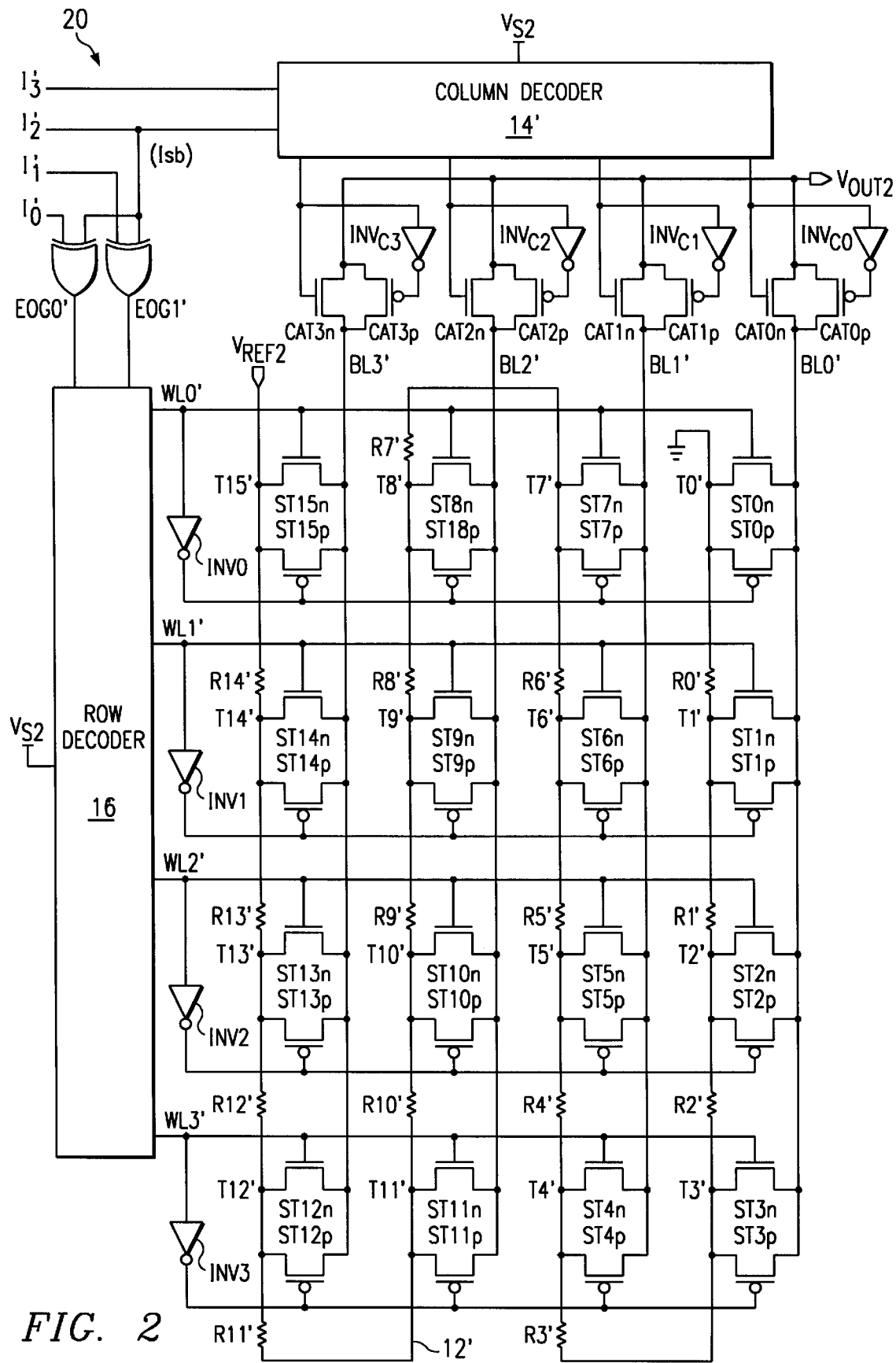
FIG. 2 illustrates a schematic of a first inventive DAC including a resistor string, where the taps of the resistor string are connected for access by CMOS switching transistor pairs.

FIG. 1 was described in the preceding Background Of The Invention section of this document and in connection with the prior art FIG. 2 illustrates a schematic of a DAC 20 according to a first inventive embodiment DAC 20 includes many components that are comparable in connection and operation to components in DAC 10 of FIG. 1. To illustrate these like components, they are shown with the same reference identifiers as in FIG. 1, with the exception that an apostrophe is added to the identifier in FIG. 2. Briefly reviewing these comparable elements of DAC 20, and assuming the reader is familiar with DAC 10, DAC 20 is a 4-to-16 DAC that receives a 4-bit input word $I_0'$–$I_3'$. DAC 20 includes a series-connected resistor string 12' in the form of a meander having fifteen resistive elements R0' through R14', formed by one of various techniques such as those known in the art and with an effort to ensure like resistance for each element. The ends of the resistive elements give rise to an array of corresponding taps T0' through T15', biased in total by a reference voltage $V_{REF2}$ and, thus, divided evenly across the taps of string 12'. For reasons detailed below, the difference between the DAC supply voltage $V_{S2}$ and $V_{REF2}$ may be, and preferably is, considerably lower tan the difference between $V_{S1}$ and $V_{REF1}$ described above. DAC 20 further includes a number of bit lines BL0' through BL3' as well as a number of word lines WL0' through WL3'.

Turning now to various items of contrast between DAC 20 and DAC 10 of the prior art, for DAC 20 each word line is connected to enable four corresponding switching transistor pairs, where in the preferred embodiment each transistor pair is a CMOS transistor configuration, that is, it includes an n-channel transistor having its source/drains connected in parallel with the source/drains of a corresponding p-channel transistor. To further illustrate and identify this distinction, in FIG. 2 the letter "n" is added to the identifier of each n-channel transistor in a switching transistor CMOS pair and the letter "p" is added to the identifier of each p-channel transistor in a switching transistor CMOS pair.

For example, looking to the CMOS switching transistor pair connected to tap T15', it includes a switching transistor ST15n and a switching transistor ST15p. One skilled in the art will easily appreciate how this convention applies equally to the remaining switching transistor pairs ST14n/ST14p through ST0n/ST0p. Also in this regard and by way of distinction, for DAC 20 each word line is connected directly to the gates of the n-channel transistors corresponding to the word line, and is further connected via an inverter to the gates of the p-channel transistors corresponding to the word line. For example, word line WL0' is connected to an input of an inverter INV0, and the output of inverter INV0 is connected to the gates of each of channel transistors ST15p, ST8p, ST7p, and ST0p. A similar connection is provided for word lines WL1', WL2', and WL3' through inverters INV1, INV2, and INV3, respectively. The use of CMOS connections is also implemented for the column access transistors in DAC 20. Specifically, each bit line is connected to a first source/drain of both an n-channel transistor and a p-channel transistor. For example, bit line BL0' is connected to a first source/drain of an n-channel column access transistor CAT0n and to a first source/drain of a p-channel column access transistor CAT0p, bit line BL1' is connected to a first source/drain of an n-channel column access transistor CAT1n and to a first source/drain of a p-channel column access transistor CAT1p, and so forth The second source/drain of each of the CMOS column access transistors are connected to an output $V_{OUT2}$. Lastly, note that an inverter is associated with each CMOS column access transistor pair so that complementary signals are connected to the gates of those transistors. For example, with respect to column access transistors CAT0n and CAT0p, column decoder 14' directly drives the gate of transistor CAT0n and further drives an input of an inverter $INV_{C0}$ which has an output connected to drive the gate of transistor CAT0p. Similarly, inverters $INV_{C1}$, $INV_{C2}$, and $INV_{C3}$ are driven by column decoder 14 to drive the gates of CAT1p, CAT2p, and CAT3p, respectively.

The operation of DAC 20 is comparable in various respects to that of DAC 10 described earlier and, thus, the common attributes are not detailed here since the reader is assumed familiar with the above discussion; of notable difference with respect to DAC 20, however, is the complementary operation of the CMOS switching transistor pairs. Particularly, decoders 14' and 16' respond to bits $I_0'$–$I_3'$ of the digital input word in the same general manner as DAC 10, whereby the two MSBs control column decoder 14' and the two LSBs, along with the lsb of the two MSBs, control row decoder 16' in combination with the logic provided by exclusive OR gates EOG0' and EOG1'. However, attention is now directed to the effect when row decoder 16' asserts one of its word lines. Looking to word line WL0' by way of example, when it is asserted high the high voltage is equal to or near the voltage level of $V_{S2}$. Assuming for now that the voltage level of $V_{S2}$ represents a logic high signal, this high signal is placed at the gates of n-channel transistors ST15n, ST8n, ST7n, and ST0n. This high signal is also inverted by inverter INV0, and the output of that inverter thereby provides a low signal to the gates of p-channel transistors ST15p, ST8p, ST7p, and ST0p. As detailed immediately below, this complementary operation better ensures that one or both of the transistors in each CMOS pair along word line WL0 conducts sufficiently, that is, this operation enables the transistor(s) to provide an adequate inversion layer to connect the charge at the corresponding tap to the bit line and while doing so with a desirable amount of resistance. Further, while a word line is asserted, a bit line is then accessed by enabling a corresponding pair of column access transistors CAT0p/CAT0n through CAT3p/CAT3n. More specifically, while row decoder 16' asserts a word line to enable its corresponding switching transistors, column decoder 14' outputs an enabling signal to the gate of a set of the CMOS column access transistors such that a selected tap voltage conducts through a switching transistor to a bit line, and then through the enabled column access transistors to $V_{OUT2}$. As also shown below, this operation may be achieved despite a relatively lesser voltage difference between $V_{S2}$ and $V_{REF2}$.

Looking in more detail to the complementary operation of the CMOS switching transistors pairs in DAC 20, the discussion now also includes a more focused examination of the difference between $V_{S2}$ and $V_{REF2}$ which, as mentioned earlier, may be less than that between $V_{S2}$ and $V_{REF1}$. Indeed, under the present embodiment, proper operation occurs even where $V_{S1}$ and $V_{REF1}$ are equal. By way of example, therefore, assume that both $V_{S2}$ and $V_{REF2}$ equal 1.8 volts. Now, consider the instance of access to tap T15', where this instance may be contrasted to the earlier discussed example for DAC 10 and the access of tap T15. In the present example, to access tap T15', row decoder 16' asserts word line WL0'. Since $V_{S2}$ equals 1.8 volts, then this assertion places a voltage equal to or near 1.8 volts along word line WL0',thereby acting as a logic high signal applied to the gates of n-channel transistors ST15n, ST8n, ST7n, and ST0n. This high signal is also inverted via inverter INV0, and the output of that inverter thereby provides a low signal (e.g., ground) to the gates of p-channel transistors ST15p, ST8p, ST7p, and ST0p which are connected to tap T15'. Since tap T15' is of concern to the present example, the remaining discussion now focuses on transistors ST15n and ST15p. With respect to n-channel transistor ST15n, the present example causes it to have a source/drain connected to 1.8 volt (i.e., $V_{REF2}$) and its gate connected to 1.8 volts (i.e., WL0). Thus, its gate-to-source voltage is 0.0 volts and it will not conduct in response thereto. At the same time, however, attention is directed to p-channel transistor ST15p. Specifically, the present example causes it to have a source/drain connected to 1.8 volt (i.e., $V_{REF2}$) and its gate connected to 0 volts (i.e., ground from the output of inverter INV0). Thus, its gate-to-source voltage is −1.8 volts and it conducts in response thereto. As a result, at least one of the parallel conductive paths of the CMOS pair consisting of transistors ST15n and ST15p provides an adequate manner for the voltage at tap T15' to conduct to bit line BL3', which then may be sampled and passed to $V_{OUT2}$ by enabling one or both of column access transistors CAT3p and CAT3n Accordingly, from this example as well as others that may be ascertained by one skilled in the art, it should be appreciated that for each of the taps in DAC 20 the complementary operation of the CMOS pairs ensure adequate conduction of a tap voltage to an output even as the voltage difference between $V_{S2}$ and $V_{REF2}$ is zero volts.

While the previous paragraph demonstrates proper operation of DAC 20 when $V_{S2}$ equals $V_{REF2}$, note further that the preferred embodiment also provides acceptable operation where the difference between those potentials is greater than zero, but also is still less than that typical of a 5.0 volt prior art device (where the difference between supply and reference voltage is typically on the order of 3.0 volts). For example, assume now that $V_{S2}$ equals 1.8 volts, and $V_{REF2}$ equals 1.0 volts and, thus, the difference between the two is 0.8 volts, and again consider the instance of access to tap T15'. In the present example, to access tap T15', row decoder 16' asserts word line WL0' at a voltage equal to or near 1.8 volts, thereby applying a logic high to the gates of n-channel transistors ST15n, ST8n, ST7n, and ST0n and, with inverter INV0, applying a low signal to the gates of p-channel transistors ST15p, ST8p, ST7p, and ST0p which are connected to tap T15'. Looking to the connections related to tap T15', and first with respect to n-channel transistor ST15n, the present example causes it to have a source/drain connected to 1.0 volt (i.e., $V_{REF2}$) and its gate connected to 1.8 volts (i.e., WL0). Thus, its gate-to-source voltage is 0.8 volts and it conducts to a certain extent in response thereto. With respect to p-channel transistor ST15p, at the same time the present example causes it to have a source/drain connected to 1.0 volt (i.e., $V_{REF2}$) and its gate connected to 0 volts (i.e., ground from the output of inverter INV0). Thus, its gate-to-source voltage is −1.0 volts and it too conducts to some extent in response thereto. As a result, the parallel conductive paths of the CMOS pair consisting of transistors ST15n and ST15p provide an adequate manner for the voltage at tap T15' to conduct to bit line BL3', which then may be sampled and passed to $V_{OUT2}$ by enabling one or both of column access transistors CAT3p and CAT3n. Accordingly, from this example as well as others that may be ascertained by one skilled in the art, it should be appreciated that for each of the taps in DAC 20 the complementary operation of the CMOS pairs ensure adequate conduction of a tap voltage to an output even as the voltage difference between $V_{S2}$ and $V_{REF2}$ is considerably reduced over that of the prior art. In other words, under the present embodiment, acceptable operation may be achieved with a difference between $V_{S2}$ and $V_{REF2}$ that is less than approximately 2.0 volts.

Figure 3:
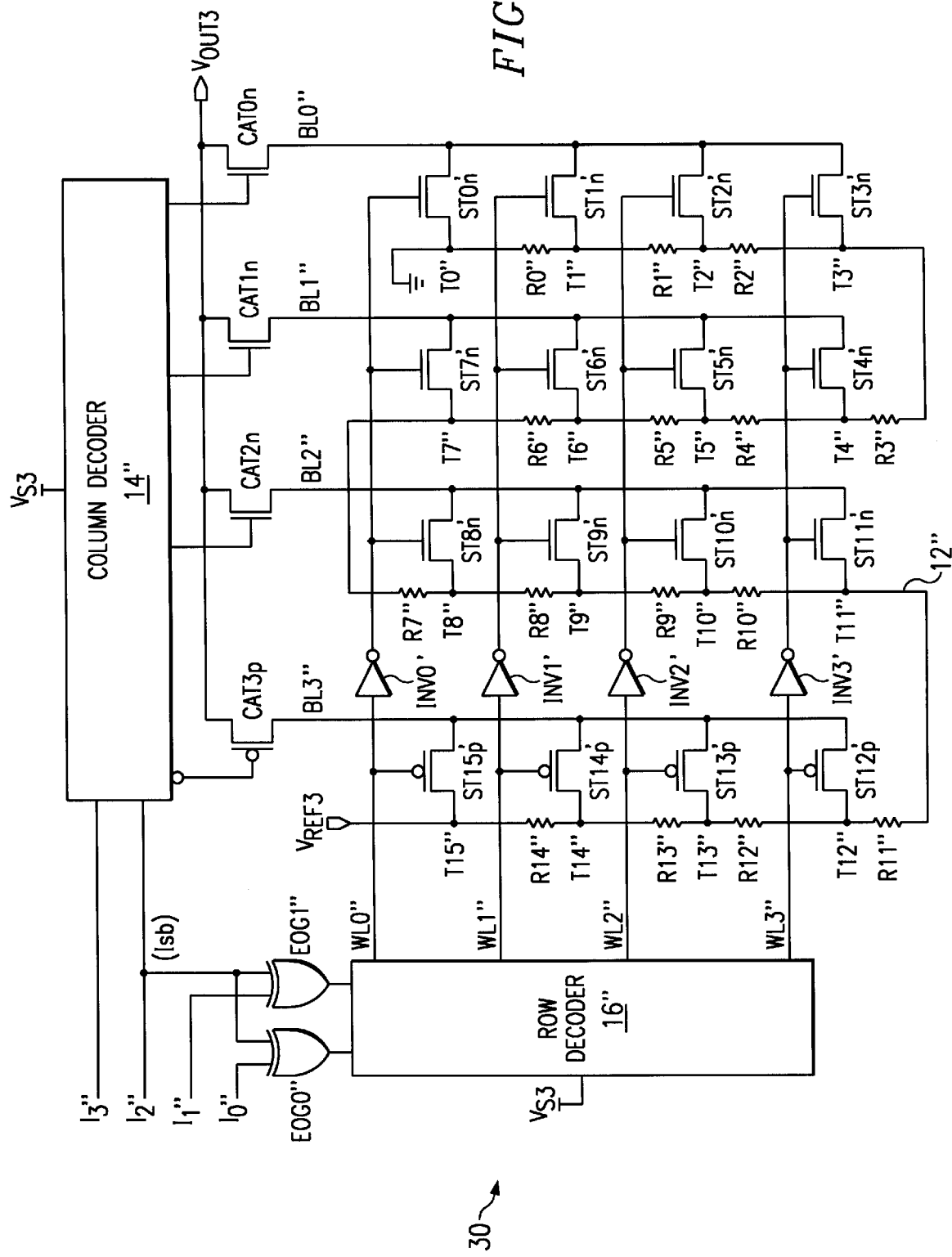
FIG. 3 illustrates a schematic of a second inventive DAC including a resistor string, where certain taps of the resistor string are accessed by p-channel switching transistors while other taps of the resistor string are accessed by n-channel switching transistors.

FIG. 3 illustrates a schematic of an alternative inventive DAC designated generally at 30. To illustrate the comparability of components in DAC 30 with those in DAC 20 of FIG. 2, such components are shown in FIG. 3 with the same reference identifiers as in FIG. 2, with the exception that an apostrophe is added to the identifier in FIG. 3 (i.e., items earlier used with no apostrophe now have a single apostrophe, and items earlier used with one apostrophe now have two apostrophes).

Briefly reviewing the comparable elements of DACs 20 and 30, a 4-bit input word $I_0"$–$I_3"$ is connected with its two MSBs to column decoder 14" and its two LSBs to row decoder 16". Moreover, the connection to row decoder 16" is through exclusive OR gates EOG0" and EOG1", with each such gate receiving one of the LSBs along with the lsb of the two MSBs. Column decoder 14" drives the gates of column access transistors which, for reasons evident below, may be either p-channel or n-channel transistors and, thus, are designated with a letter identifying them as such thereby including n-channel transistors CAT0n, CAT1n, CAT2n, and p-channel transistor CAT3p, with one source/drain of those transistors connected to an output $V_{OUT3}$ and the other source/drain of those transistors connected to a corresponding one of bit lines BL0" through BL3". Row decoder 16" drives word lines WL0" through WL3", where those word lines are connected to the gates of switching transistors as detailed later. Lastly, DAC 30 includes a series-connected meander resistor string 12" having fifteen resistive elements R0" through R14' formed in a desirable fashion to have like resistance for each element, and where the ends of the resistive elements give rise to an array of corresponding taps T0" through T15".

Turning now to various items of contrast between DAC 30 and DAC 20, for DAC 30 only a single switching transistor is connected between each corresponding tap and one of the bit lines. However, as now appreciated, the conductivity type for some of these transistors is different than for others. More particularly, in the example of DAC 30, the four switching transistors having a source/drain connected to bit line BL3" are p-channel transistors, while the remaining switching transistors in DAC 30 are n-channel transistors. Also in this regard, each of word lines WL0" through WL3" is connected directly to drive a gate of respective peel transistors ST15p' through ST12p', and further is connected to the input of a respective inverter INV0' through INV3'. The outputs of each of inverters INV0' through INV3' are connected to the gates of the remaining n-channel switching transistors for the corresponding word line. For example, the output of inverter INV0' is connected to the gates of n-channel switching transistors ST8n', ST7n', and ST0n', the output of inverter INV1' is connected to the gates of n-channel switching transistors ST9n', ST6n', and ST1n', and so forth Having noted the different conductivity types of the switching transistors based on the bit line to which they correspond, note further that the same conductivity type is preferably used for the column access transistor corresponding to the bit line. For example, for bit line BL3", its switching transistors are p-channel transistors and, hence, for the column access transistor corresponding to bit line BL3", namely, transistor CAT3p, it too is a p-channel transistor. In an alternative embodiment, however, each of the column access transistors may be replaced with a CMOS pair of transistors. Lastly, for purposes of later discussion and to avoid confusion with earlier voltages, with respect to DAC 30 a different supply voltage $V_{S3}$ and difference reference voltage $V_{REF3}$ are identified, where $V_{S3}$ is the overall supply voltage and $V_{REF3}$ is the bias across string 12". Like DAC 20, however, for DAC 30 the difference between $V_{S3}$ and $V_{REF3}$ may be considerably lower than the difference between $V_{S1}$ and $V_{REF1}$ described above in connection with the prior art.

The operation of DAC 30 is comparable in various respects to that of DAC 10 described earlier and once more the common attributes are not detailed here since the reader is assumed familiar with the above discussion; of notable difference however is the use of different conductivity types of switching transistors within the array which ultimately permits a lower voltage difference between $V_{S3}$ and $V_{REF3}$. In general, decoders 14" and 16" respond to bits $I_0"$–$I_3"$ of the digital input word in a comparable general manner as DAC 10, whereby the two MSBs control column decoder 14" and the two LSBs, along with the lsb of the two MSBs, control row decoder 16" in combination with exclusive OR gates EOG0" and EOG1". However, attention is now directed to the effect when row decoder 16" asserts one of its word lines. Specifically, in the preferred embodiment, a word line is asserted by placing it in the logic state corresponding to the level opposite of $V_{S3}$. Looking to word line WL0" by way of example, when it is asserted a low voltage (e.g., ground) is placed on the word line, and this is connected directly to the gate of p-channel switching transistor ST15p'. However, this same logic low level passes through inverter INV0' and, thus, is output at a voltage equal or near the voltage level of $V_{S3}$. Accordingly, the logic high signal of $V_{S3}$ (or a value near to it) is placed at the gates of n-channel transistors ST8n', ST7n', and ST0n'. As detailed immediately below, therefore, this use of different conductivity types on one side of inverter INV0' versus the other also again ensures that an adequate inversion layer is formed by each transistor along the asserted word line while also doing so with a desirable amount of resistance.

Looking now in more detail to the use of different conductivity types along a word line of DAC 30, the discussion now also includes a more focused examination of the difference between $V_{S3}$ and $V_{REF3}$ which, as mentioned earlier, may be less than that between $V_{S3}$ and $V_{REF1}$ of the prior art. Indeed, as with the embodiment of FIG. 2, here the present embodiment provides proper operation even where $V_{S1}$ and $V_{REF1}$ are equal. By way of example, therefore, assume that both $V_{S3}$ and $V_{REF3}$ equal 1.8 volts. Now consider the instance of access to tap T15", where this instance may be contrasted to the earlier discussed example for DAC 10 and the access of tap T15. In the present example, to access tap T15", row decoder 16" asserts word line WL0" low, where low is the logical opposite of the value of $V_{S3}$ and, therefore, this low value in the current example equals ground. Thus, a ground potential is connected to the gate of p-channel switching transistor ST15p'. In addition, due to inverter INV0' and the level of $V_{S3}$ equal to 1.8 volts, then a voltage equal to or near 1.8 volts is connected to the gates of n-channel switching transistors ST8n', ST7n', and ST0n'. Since tap T15" is of concern to the present example, the remaining discussion now focuses on transistor ST15p' which is connected to tap T15". Specifically, the present example causes transistor ST15p' to have a source/drain connected to 1.8 volts (i.e., $V_{REF3}$) and its gate connected to zero volts. Thus, its gate-to-source voltage is −1.8 volts and it conducts in response thereto, even with $V_{S3}$ equal to $V_{REF3}$. As a result, the conductive path provided by transistor ST15p' provides an adequate manner for the voltage at tap T15" to conduct to bit line BL3", which then may be sampled and passed to $V_{OUT3}$ by enabling column access transistor CAT3p.

Next, consider an example where $V_{S3}$ and $V_{REF3}$ are not equal, but the difference between them is less than that typical of the prior art. By way of example, therefore, assume that $V_{S3}$ equals 1.8 volts and $V_{REF3}$ equals 1.0 volts, and again consider the instance of access to tap T15". Thus, row decoder 16" asserts word line WL0" low (i.e., ground), and the low potential is connected to the gate of p-channel switching transistor ST15p'. In addition, due to inverter INV0' and the level of $V_{S3}$ equal to 1.8 volts, then a voltage equal to or near 1.8 volts is connected to the gates of n-channel switching transistors ST8n', ST7n', and ST0n'. Focusing on tap T15" and the devices connected thereto, the present example causes transistor ST15p' to have a source/drain connected to 1.0 volt (i.e., $V_{REF3}$) and its gate connected to zero volts. Thus, its gate-to-source voltage is −1.0 volts and it conducts in response thereto, even with the relatively small difference between $V_{S3}$ and $V_{REF3}$. As a result, again the conductive path provided by transistor ST15p' provides an adequate manner for the voltage at tap T15" to conduct to bit line BL3", which then may be sampled and passed to $V_{OUT3}$ by enabling column access transistor CAT3p.

The preceding example may be further expanded to one of the n-channel switching transistors of DAC 30 to further appreciate the overall DAC operation and its benefits. Thus, by way of example, consider once more the assertion of word line WL0", but suppose in this instance the intent is to access tap T8". In this case, with respect to n-channel transistor ST8n', the present example causes it to have a source/drain connected to tap T8" which, according to voltage division, has a potential of 0.53 volts (i.e., $V_{REF3}$ * 8/15=0.53 volts), while its gate is connected to 1.8 volts (i.e., $V_{S3}$). Thus, its gate-to-source voltage is approximately 1.27 volts and it conducts in response thereto, thereby providing an adequate manner for the voltage at tap T8" to conduct to bit line BL2", which then may be sampled and passed to $V_{OUT3}$ by enabling column access transistor CAT2n.

Given the preceding examples of tap access by either a p-channel or n-channel switching transistor, one skilled in the art should appreciate the comparable manner in which each of the other taps in DAC 30 may be accessed. In this regard, one skilled in the art also should note that in the preferred embodiment the switching transistors nearest the larger string potential (i.e., $V_{REF3}$) are p-channel transistors, while the switching transistors nearest the lower string potential (e.g., ground) are n-channel transistors. Moreover, in one preferred approach, there may be a larger number of n-channel switching transistors than p-channel switching transistors because mobility for n-channel transistors is greater than that of p-channel transistors. Further, while DAC 30 is shown to have one-fourth p-channel transistors and three-fourths n-channel transistors, the actual number of each for a given implementation may be adjusted by one skilled in the art given various criteria. For example, the actual supply voltage used to bias the circuit as a whole versus the resistor string bias may well be a key consideration in determining the desirable number of p-channel transistor versus the desirable number of n-channel transistors. As another example, layout considerations may give rise to a preferred embodiment having an equal number of n-channel and p-channel transistors. Further in this regard, layout considerations likely also give rise to the preferred notion that the split between n-channel and p-channel transistors occur between bit lines than and not along a bit line. In this manner, therefore, inverters INV0' through INV3' may be formed in a column fashion, and they also separate the area (e.g., well) in which the n-channel transistors are formed from the area (e.g., well) in which the p-channel transistors are formed. Lastly in this regard, note that one of the resistive elements in string 12" will have to span between these separated areas. For example, from a layout perspective of FIG. 3 resistive element R11" spans between the separate areas of transistors. As a result, the shape of resistive element R11" is likely to be different, and most likely longer, than that of the remaining resistive elements. Accordingly, attention must be made to ensuing that resistive element R11" has as dose a resistance as possible to the other resistive elements in string 12". One approach, therefore, is to form resistive element R11" using a resistor network, such as one resistor in parallel with one or more series resistors.

From the preceding examples and others that may be ascertained by one skilled in the art, it should be appreciated that for each of the taps in DAC 30 the use of one of two different conductivity types of switching transistors ensures adequate transmission of a tap voltage to an output even as the voltage difference between $V_{S3}$ and $V_{REF3}$ is considerably reduced over that of the prior art. Accordingly, under the present embodiment and also as was the case for the embodiment of FIG. 2, acceptable operation may be achieved with a difference between $V_{S3}$ and $V_{REF3}$ that is less than approximately 2.0 volts.

Figure 4A:
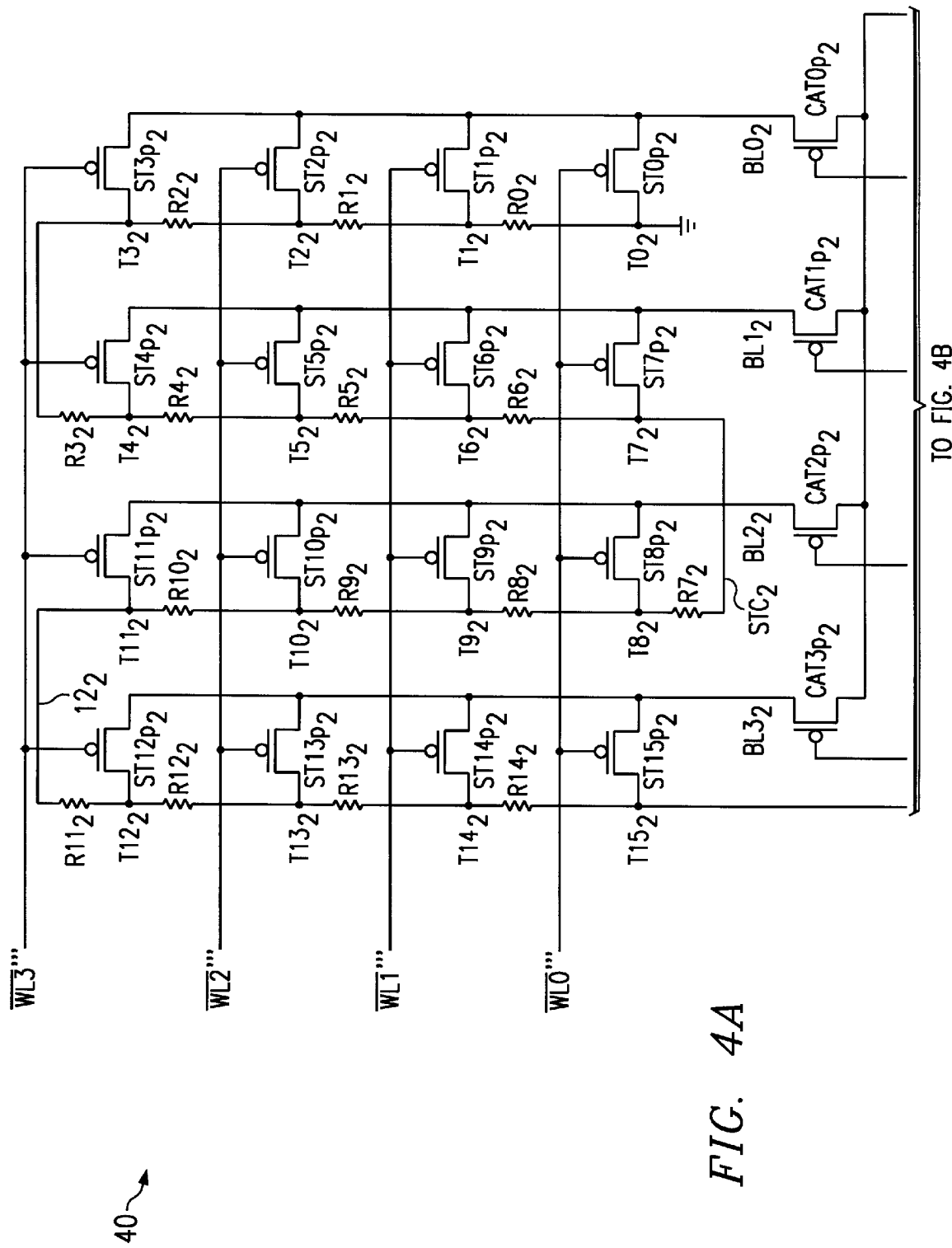
FIGS. 4A and 4B illustrate a schematic of a third inventive DAC including two resistor strings, where the voltage taps of a first of the resistor strings are accessed by p-channel switching transistors while the voltage taps of a second of the resistor strings are accessed by n-channel switching transistors.
Figure 4B:
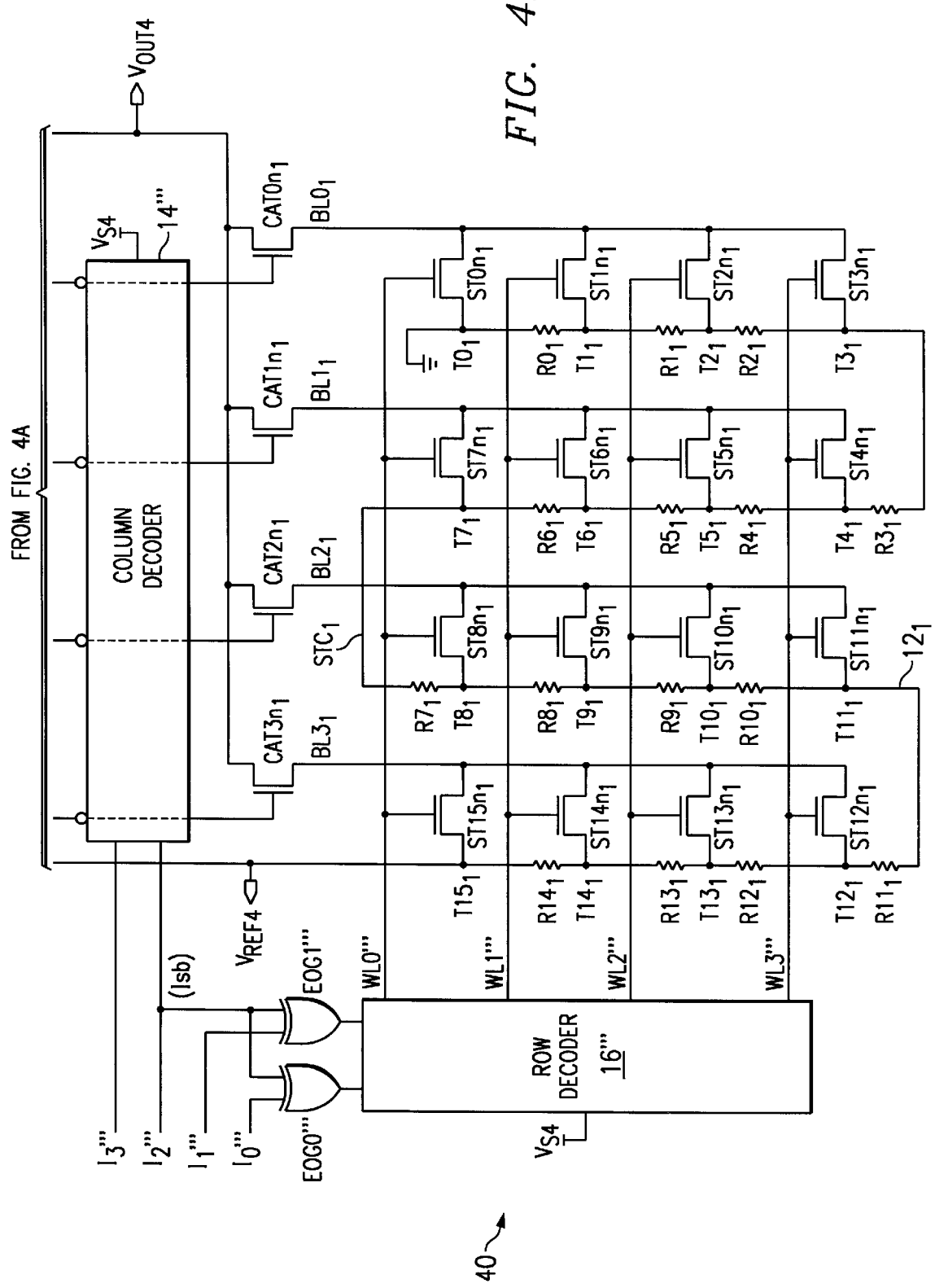

FIGS. 4A and 4B illustrate a schematic of another alternative inventive DAC, here designated generally at 40. Once more to illustrate the comparability of certain components in DAC 40 with those of earlier DACs, similar reference identifiers are used as in FIG. 3 with the exception that an apostrophe is added to the identifier in FIGS. 4A and 4B for various comparable items. The convention for other items will be more apparent later. In addition, the following discussion focuses primarily on the contrast of DAC 40 with the earlier embodiments while one skilled in the art may appreciate the comparable aspects, only some of which are further noted below.

A first distinction between DAC 40 and the various DACs described above is that DAC 40 includes two separate resistor strings, designated as string $12_1$ and string $12_2$. In many respects, string $12_1$ and its connections to bit lines, word lines, and switching transistors is the same as DAC 10 of FIG. 1. Thus, string $12_1$ includes fifteen equal resistance resistive elements $R0_1$ through $R14_1$, giving rise to sixteen voltage taps $T0_1$ through $T15_1$. A bias $V_{REF4}$ is applied across string $12_1$, here by connecting that potential to tap $T15_1$ and connecting tap $T0_1$ of the string to ground. Each of taps $T0_1$ through $T15_1$ is connected to a first source/drain of an n-channel switching transistor, where the identifier of each such transistor includes the same number as the tap corresponding to the transistor, an "n" to indicate the n-type conductivity of the transistor, and a subscript "1" to indicate that the transistor corresponds to the resistor string having the same subscript, namely, string $12_1$. The second source/drains of the switching transistors are connected to one of bit lines $BL0_1$ through $BL3_1$ such that four switching transistors are connected in this manner per bit line. Each bit line is connected to a first source/drain of a corresponding one of four column access transistors $CAT0n_1$ through $CAT3n_1$. In the preferred embodiment, column access transistors $CAT0n_1$ through $CAT3n_1$ are each n-channel transistors having a gate connected to a column decoder 14''' and a second source/drain to an output $V_{OUT4}$. Column decoder 14''' is powered by a system supply voltage $V_{S4}$ and, therefore, asserts a logic high equal to or near $V_{S4}$. Lastly, the switching transistors are again arranged according to word lines so that sets of four switching transistors have their gates connected to a corresponding one of word lines WL0''' through WL3'''. Word lines WL0''' through WL3''' are selectively asserted by a row decoder 16''' which is also powered by $V_{S4}$ and, thus, which asserts a logic high equal to or near $V_{S4}$.

Looking now to string $12_2$, it represents a duplicate of string $12_1$ and, thus, includes fifteen equal resistance resistive elements $R0_2$ through $R14_2$, where the resistance of these elements is designed to be the same for each element and also to be the same as each element in string $12_1$. Resistive elements $R0_2$ through $R14_2$ also give rise to sixteen voltage taps $T0_2$ through $T15_2$. The bias $V_{REF4}$ is applied across string $12_2$ by connecting that potential to tap $T15_2$ and connecting the other end of the string to ground. Each of taps $T0_2$ through $T15_2$ is also connected to a switching transistor, but here note the conductivity type is complementary to the type used in connection with string $12_1$. Thus, each of taps $T0_2$ through $T15_2$ is connected to a first source/drain of a p-channel switching transistor, where the identifier of each such transistor includes the same number as the tap corresponding to the transistor, a "p" to indicate the p-type conductivity of the transistor, and a subscript "2" to indicate that the transistor corresponds to the resistor string having the same subscript, namely, string $12_2$. The second source/drains of the switching transistors are connected to one of bit lines $BL0_2$ through $BL3_2$ such that four switching transistors are connected in this manner per bit line. Each bit line is connected to a first source/drain of a corresponding one of four column access transistors $CAT0p_2$ through $CAT3p_2$. In the preferred embodiment, column access transistors $CAT0p_2$ through $CAT3p_2$ are each p-channel transistors having a gate connected to an inverted output of column decoder 14''' and a second source/drain to $V_{OUT4}$. For purposes of illustration, note that the inverted output from column decoder 14''' is shown with a bubble and a dashed line to indicate that it corresponds to one of the column access transistor enable signals associated with string $12_1$ for reasons discussed below. Lastly, the switching transistors are arranged according to word lines so that sets of four switching transistors have their gates connected to a corresponding one of the complemented signals from word lines WL0''' through WL3''' (shown in FIGS. 4A and 4B as $\overline{WL0'''}$ through From the above, one skilled in the art will appreciate that strings $12_1$ and $12_2$ have mutual connections to $V_{REF4}$ and ground. In addition, in the preferred embodiment there are one or more stitch connections between the strings at like locations along each string, that is, between tap numbers that are the same for each of strings $12_1$ and $12_2$. For purposes of illustration therefore, using taps 7 and 8 as a like location, then a node $STC_1$ located between taps $T7_1$ and $T8_1$ of string $12_1$ may be connected to a node $STC_2$ located between taps $T7_2$ and $T8_2$ of string $12_2$. Thus, each of these mutual connections, as well as others which may be added at other symmetric locations about both strings operate to ensure that $V_{REF4}$ is uniformly distributed across both strings. This division of $V_{REF4}$ is desirable given the operation of DAC 40 as further detailed below.

In general, the operation of DAC 40 is such that for a given tap access, the output voltage $V_{OUT4}$ may be provided from either or both of strings $12_1$ and $12_2$, where a complementary operation occurs with respect to each string. More specifically, the operation of DAC 40 is such that a voltage passes to $V_{OUT4}$ from one or both strings and, more particularly, from the taps of those strings having the same numeric identifier (albeit with a different subscript). In other words, if an input gives rise to an access of tap $T4_1$ of string $12_1$, then a concurrent access may occur to tap $T4_2$ of string $12_2$. This operation is illustrated below by examples.

As an example of the operation of DAC 40, assume that a digital input word equal to 1110 is presented to inputs $I_3'''-I_0'''$. Since the decimal value of this input is 14, then it should be anticipated that one or both of taps $T14_1$ and $T14_2$ will contribute to the voltage conducted to $V_{OUT4}$. This expectation is now confirmed by tracing the operation in greater detail. From the input of 1110, its two MSBs are coupled to column decoder 14''' and, thus, the value of 11 is received by column decoder 14'''. In response, column decoder 14''' enables the gate of the column access transistors for both strings $12_1$ and $12_2$ having a numeric identifier equal to the decimal value of the two MSBs. Here, the MSBs of 11 equal a decimal value of 3 and, thus, column decoder 14''' enables the gate of column access transistors $CAT3n_1$ and $CAT3p_1$. Given the conductivity type of these transistors, therefore, column decoder 14''' enables transistor $CAT3n_1$ by applying a logic high (i.e., $V_{S4}$) to its gate and enables transistor $CAT3p_1$ by applying the complementary signal of a logic low (i.e., ground) to its gate. Turning now to row decoder 16''', it responds to the 10 value of the two LSBs of the 4-bit input via exclusive OR gates EOG0''' and EOG1'''; since the lsb of the two MSBs equals 1 in this example, then the complements 01 of the LSBs pass to row decoder 16'''. Row decoder 16''' responds by asserting the word line having a decimal numeric identifier equal to the 01 value of the received complemented LSBs; thus, in the present example row decoder 16''' asserts word line WL1''' high. Note that this high signal is connected to the gates of switching transistors $ST14n_1$, $ST9n_1$, $ST6n_1$, and $ST1n_1$. At the same time, however, the low complement of this signal is connected to the gates of switching transistors $ST14p_2$, $ST9p_2$, $ST6p_2$, and $ST1p_2$. To further examine the response of these switching transistors, note further that such response depends on the voltage difference between $V_{S4}$ and $V_{REF4}$. This aspect is further explored by way of a few examples below.

As a first example to illustrate the response of switching transistors given a certain voltage difference between $V_{S4}$ and $V_{REF4}$, assume that $V_{S4}$ and $V_{REF4}$ both equal 1.8 volts, that is, the difference between $V_{S4}$ and $V_{REF4}$ equals zero volts. Continuing with the present example of an input value of 1110 which implicates taps $T14_1$ and $T14_2$, the discussion now focuses on the switching transistors corresponding to those taps. With respect to tap $T14_1$ and its corresponding switching transistor $ST14n_1$, its gate receives a voltage of 1.8 volts (i.e., $V_{S4}$ and its source/drain connected to tap $T14_1$ is biased by a voltage of 1.68 volts (i.e., $14/15*V_{REF}=14/15*5=1.68$). As a result, its gate-to-source voltage is approximately 0.12 volts and, thus, is likely insufficient to cause switching transistor $ST14n_1$ to satisfactorily conduct. With respect to tap $T14_2$ and its corresponding switching transistor $ST14p_1$, however, its gate is connected to ground (i.e., the complement of $V_{S4}$) and its source/drain connected to tap $T14_2$ is also biased by a voltage of 1.68 volts. As a result, its gate-to-source voltage is approximately −1.68 volts and, thus, causes switching transistor $ST14p_1$ to satisfactorily conduct Given the preceding assumptions, therefore, in this example switching transistor $ST14p_1$ conducts its corresponding tap voltage to $V_{OUT4}$.

As a second example to illustrate the response of switching transistors given a certain voltage difference between $V_{S4}$ and $V_{REF4}$, assume now that $V_{S4}$ equals 1.8 volts and $V_{REF4}$ equals 1.0 volt, that is, the difference between $V_{S4}$ and $V_{REF4}$ equals 0.8 volts. Assume once more that the input value is 1110 and, therefore, directed to taps $T14_1$ and $T14_2$. With respect to tap $T14_1$ and its corresponding switching transistor $ST14n_1$, its gate receives a voltage of 1.8 volts (i.e., $V_{S4}$) and its source/drain connected to tap $T14_1$ is biased by a voltage of 0.75 volts (i.e., $14/15*V_{REF4}/15*0.8=0.75$). As a result, its gate-to-source voltage is approximately 1.05 volts; accordingly, this voltage is sufficient to cause switching transistor $ST14n_1$ to satisfactorily conduct. In addition, with respect to tap $T14_2$ and its corresponding switching transistor $ST14p_1$, its gate is connected to ground (i.e., the complement of $V_{S4}$) and its source/drain connected to tap $T14_2$ is biased by a voltage of 0.75 volts. As a result, its gate-to-source voltage is approximately −0.75 volts and, thus, it causes switching transistor $ST14p_1$ to at least partially conduct. Given the preceding assumptions, at least one or both of switching transistors $ST14n_1$ and $ST14p_1$ conduct. As a result, the tap voltage from either or both of taps $T14_1$ and $T14_2$ passes to $V_{OUT4}$ and thus an appropriate analog voltage is provided corresponding to the digital input signal.

From the preceding examples as well as others that may be ascertained by one skilled in the art, it should be appreciated that the use of complementary conductivity type transistors in DAC 40 for strings $12_1$ and $12_2$ ensures adequate conduction of a tap voltage to an output even as the voltage difference between $V_{S4}$ and $V_{REF4}$ is considerably reduced over that of the prior art. Depending on the level to which the complementary switching transistors are enabled, this conduction may be from either a single tap in string $12_1$ or a like numbered single tap in string $12_2$, or from both such taps. In any event, under the present embodiment as was the case for the earlier inventive embodiments, acceptable operation may be achieved with a difference between $V_{S4}$ and $V_{REF4}$ that is less than approximately 2.0 volts.

Having presented various different embodiments as illustrated by ways of example in FIGS. 2, 3, and 4, some final observations are noteworthy regarding various benefits arising from those embodiments as well as a consideration regarding the possibility of choosing among the various embodiments given different circuit applications. In this regard, it has been shown that each embodiment provides adequate operation with a difference between supply voltage and string voltage that may be smaller than that of the prior art. In addition, each embodiment also achieves its operation using some combination of both p-channel and n-channel switching transistors. As an additional consideration, note that device size may be a factor in selecting from the implementations illustrated by DAC 20, 30, and 40. Indeed, note that some of the topologies provided by the various embodiments described herein give rise to a DAC formed in minimum chip area using a CMOS process. This minimum chip area provides maximum linearity since the resistor array does not span a large distance over which processing gradients will affect the resistor values. In addition, the typical design rules of a CMOS process require as the greatest distance limitation the distance between devices outside of wells and the wells themselves. This is due to the light doping levels in wells, and the long depletion zones that need to be avoided. Moreover, it is very expensive in terms of area to flip back and forth between p and n semiconductor types in each cell in that such an approach yields a considerably large cell and a potentially nonlinear DAC. In view of these considerations, DACs 30 and 40 may be favorable for certain applications since all the p devices are collected to one side of the array and can all be immersed in one large well. In contrast, for DAC 20 each cell includes a CMOS pair and, thus, DAC 20 must be large enough to accommodate its own well region to house one of the polarities of the MOS devices. Additionally, each cell of DAC 20 requires an additional word line as compared to the prior art DAC 10. DACs 30 and 40 avoid the well size limitation by implementing only a single switching transistor per cell. Of course, with DAC 40 the use of two arrays of switching transistors (and resistor strings) also increases device size relative to an embodiment such as DAC 30. As another consideration, note that both DAC 20 and DAC 40 also will operate if the string potentials are reversed; in other words, while the highest numbered tap of the strings of DACs 20 and 40 are shown above as connected to positive voltages $V_{REF2}$ and $V_{REF4}$, respectively, and the lowest numbered tap is connected to ground, proper operation is also ensured if the highest numbered tap of the strings of those DACs is connected to ground while the lowest numbered tap is connected to a potential equal to or within approximately 2.0 volts of the supply voltage. Indeed, the added flexibility provided by this ability to reverse string potentials may make either DAC 20 or DAC 40 a good candidate for use as a multiplier. More particularly, a variable voltage could be applied across the string in which case the DAC output presents a multiplier product, where the product is the voltage at a given instance across the string times the digital value input to the DAC An application by way of example would be to apply an audio signal across the string and then use a digital control to the input of the DAC such that the output is effectively a volume-controlled version of the audio signal. In any event, therefore, one skilled in the art will further appreciate this additional benefit to DACs 20 and 40.

From the above, it may be appreciated that the present embodiments provide numerous advantages over the prior art, many of which have been set forth above and additional ones of which will be ascertained by one skilled in the art. For example, the preferred configurations may apply either to DACs or ADCs. In addition, while the present embodiments have been described in detail, various substitutions, modifications or alterations could be made to the descriptions set forth above without departing from the inventive scope. Indeed, some of these type of variations have been set forth above, and still others may be ascertained. For example, while resistor strings with relatively small numbers of resistors have been illustrated, the present teachings apply equally if not more beneficially to strings with larger numbers of resistors. Thus, the preceding as well as other ascertainable examples should further illustrate the inventive scope, where that scope is defined by the following claims.

What is claimed is:

1. A data converter, comprising:
    an input for receiving a digital word;
    at least one string of series connected resistive elements, wherein the at least one string comprises a plurality of voltage taps and is operable to receive a string bias of X volts;
    an output for providing an analog voltage level in response to the digital word; and
    a plurality of switching transistors coupled between the plurality of voltage taps and the output;
    wherein, responsive to at least a portion of the digital word, selected ones of the switching transistors are operable to receive a gate bias to enable the corresponding switching transistor to provide a conductive path from a corresponding one of the voltage taps toward the output; and
    wherein a difference between X volts and the gate bias is less than approximately 2.0 volts.

2. The data converter of claim 1:
    wherein the plurality of voltage taps comprise an integer N number of voltage taps; and
    wherein the plurality of switching transistors comprise an integer number equal to two times N of switching transistors.

3. The data converter of claim 2 wherein the plurality of switching transistors comprise a pair of complementary conductivity type transistors coupled in parallel between each of the plurality of voltage taps and the output.

4. The data converter of claim 1:
    wherein the plurality of switching transistors comprise a single transistor coupled between each of the plurality of voltage taps and the output;
    wherein a first set of the plurality of switching transistors are of a first conductivity type; and
    wherein a second set of the plurality of switching transistors are of a second conductivity type different than the first conductivity type.

5. The data converter of claim 4:
    wherein the first conductivity type transistor of the first set is an n-channel transistor;
    wherein the second conductivity type transistor of the second set is a p-channel transistor; and
    wherein the first set contains more transistors than the second set.

6. The data converter of claim 5:
    wherein the plurality of voltage taps provide a sequence of taps comprising a first tap for connecting to a first potential and a last tap for connecting to a second potential, the first potential being lower than the second potential;
    wherein the first set of the plurality of switching transistors are coupled to successive ones of the voltage taps starting with the first tap and up to an intermediate tap; and
    wherein the second set of the plurality of switching transistors are coupled to successive ones of the voltage taps starting with a tap immediately after the intermediate tap and up to the last tap.

7. The data converter of claim 4:
    wherein the plurality of voltage taps provide a sequence of taps comprising a first tap for connecting to a first potential and a last tap for connecting to a second potential, the first potential being lower than the second potential;
    wherein the first set of the plurality of switching transistors are coupled to successive ones of the voltage taps starting with the first tap and up to an intermediate tap; and
    wherein the second set of the plurality of switching transistors are coupled to successive ones of the voltage taps starting with a tap immediately after the intermediate tap and up to the last tap.

8. The data converter of claim 4:
    wherein the first conductivity type transistor of the first set is an n-channel transistor;
    wherein the second conductivity type transistor of the second set is a p-channel transistor; and
    wherein the first set contains a same number of transistors as the second set.

9. The converter of claim 1:
    wherein the at least one string comprises a first string and the plurality of voltage taps comprises a first plurality of voltage taps;
    wherein the plurality of switching transistors comprises a first plurality of switching transistors;
    and wherein the converter further comprises:
        a second string of series connected resistive elements, wherein the second string comprises a second plurality of voltage taps and is operable to receive the string bias;
        a second plurality of switching transistors coupled between the second plurality of voltage taps and the output; and
        wherein, responsive to at least a portion of the digital word, selected ones of the second plurality of switching transistors are operable to receive a gate bias to enable the corresponding switching transistor from the second plurality of switching transistors to provide a conductive path from a corresponding one of the second plurality of voltage taps toward the output.

10. The converter of claim 9 wherein the first string has an overall resistance approximately equal to an overall resistance of the second string.

11. The converter of claim 9:
    wherein the first plurality of voltage taps comprise a first set of sequentially numbered voltage taps;
    wherein the second plurality of voltage taps comprise a second set of sequentially numbered voltage taps;
    and further comprising at least one electrical connection between a stitch tap of the first string and a stitch tap of the second string, wherein the stitch tap of the first string is located at a selected location between a pair of the sequentially numbered voltage taps in the first string and wherein the stitch tap of the second string is located at a selected location between a pair of the sequentially numbered voltage taps in the second string having a same numbering as the location between the pair of the sequentially numbered voltage taps in the first string.

12. The converter of claim 9:

wherein the first plurality of switching transistors are of a first conductivity type; and wherein the second plurality of switching transistors are of a second conductivity type different than the first conductivity type.

13. The data converter of claim 12:

wherein the first plurality of switching transistors are p-channel transistors; and wherein the second plurality of switching transistors are n-channel transistors.

14. The converter of claim 9:

wherein the first string has an overall resistance approximately equal to an overall resistance of the second string;

wherein the first plurality of switching transistors are of a first conductivity type; wherein the second plurality of switching transistors are of a second conductivity type different than the first conductivity type;

wherein the first plurality of voltage taps comprise a first set of sequentially numbered voltage taps;

wherein the second plurality of voltage taps comprise a second set of sequentially numbered voltage taps;

and further comprising at least one electrical connection between a stitch tap of the first string and a stitch tap of the second string, wherein the stitch tap of the first string is located at a selected location between a pair of the sequentially numbered voltage taps in the first string and wherein the stitch tap of the second string is located at a selected location between a pair of the sequentially numbered voltage taps in the second string having a same numbering as the location between the pair of the sequentially numbered voltage taps in the first string.

15. The data converter of claim 1 wherein the plurality of switching transistors comprise a pair of complementary conductivity type transistors coupled in parallel between each of the plurality of voltage taps and the output.

16. The data converter of claim 1 wherein the difference between X volts and the gate bias is approximately zero volts.

17. The data converter of claim 1 wherein the gate bias is equal to or less than approximately 3.3 volts.

18. The data converter of claim 1 wherein the gate bias is equal to or less than approximately 1.8 volts.

19. A data converter, comprising:

an input for receiving a digital word;

at least one string of series connected resistive elements, wherein the at least one string comprises a plurality of voltage taps;

an output for providing an analog voltage level in response to the digital word; and a plurality of switching transistors coupled between the plurality of voltage taps and the output;

wherein, responsive to at least a portion of a first digital word, an n channel transistor of the switching transistors receives a gate bias and is enabled to provide a first conductive path from a corresponding one of the voltage taps toward the output; and wherein, responsive to at least a portion of a second digital word, a p-channel transistor of the switching transistors receives a gate bias and is enabled to provide a second conductive path from a corresponding one of the voltage taps toward the output.

20. A method of operating a data converter comprising a plurality of voltage taps; the method comprising the steps of:

receiving a first digital word at an input;

responsive to at least a portion of the first digital word, applying a gate bias to an n-channel switching transistor having a first source/drain connected to one of the plurality of voltage taps and for coupling a voltage at the first source/drain of the n-channel transistor to an output for providing a first analog voltage responsive to the first digital word;

receiving a second digital word at the input; and responsive to at least a portion of the second digital word, applying a gate bias to a p-channel switching transistor having a first source/drain connected to one of the plurality of voltage taps and for coupling a voltage at the first source/drain of the p-channel transistor to an output for providing a second analog voltage responsive to the second digital word.

* * * * *